United States Patent
Wong et al.

(10) Patent No.: US 10,749,729 B1
(45) Date of Patent: Aug. 18, 2020

(54) SYSTEM AND METHOD FOR AUTOMATIC GAIN CONTROL ADAPTATION

(71) Applicant: Xilinx, Inc., San Jose, CA (US)

(72) Inventors: Alan C. Wong, San Jose, CA (US);
Hong Sik Ahn, San Jose, CA (US);
Edward Lee, Mountain View, CA (US);
Christopher J. Borrelli, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/424,328

(22) Filed: May 28, 2019

(51) Int. Cl.
| | | |
|---|---|---|
| *H04L 27/12* | (2006.01) | |
| *H04B 1/20* | (2006.01) | |
| *H04L 27/38* | (2006.01) | |
| *H03G 3/30* | (2006.01) | |
| *H04B 1/16* | (2006.01) | |
| *H04L 25/03* | (2006.01) | |

(52) U.S. Cl.
CPC ....... *H04L 27/3809* (2013.01); *H03G 3/3036* (2013.01); *H03G 3/3052* (2013.01); *H04B 1/16* (2013.01); *H04L 25/03057* (2013.01); *H04L 25/03885* (2013.01)

(58) Field of Classification Search
CPC .... H04B 7/061; H04B 7/0617; H04B 7/0634; H04B 7/0639; H04B 7/0663; H04B 7/0456; H04B 7/0482; H04B 7/0673; H04W 16/28; H04L 25/0246; H03M 1/18
See application file for complete search history.

(56) References Cited

U.S. PATENT DOCUMENTS

| | | | | |
|---|---|---|---|---|
| 5,563,916 | A * | 10/1996 | Scarpa ................... | H03G 3/001 375/345 |
| 9,595,990 | B1 * | 3/2017 | Zhang ................. | H03G 3/3078 |
| 2003/0064692 | A1 * | 4/2003 | Shi ........................... | H03F 1/32 455/232.1 |
| 2005/0286624 | A1 * | 12/2005 | Park .................... | H03H 21/0012 375/232 |
| 2008/0170646 | A1 * | 7/2008 | Sobchak .............. | H03G 3/3057 375/345 |
| 2009/0058531 | A1 * | 3/2009 | Hwang ................ | H03G 3/3068 330/278 |
| 2009/0092181 | A1 * | 4/2009 | Sontowski ........ | H04L 25/03019 375/232 |
| 2010/0235707 | A1 * | 9/2010 | Su ......................... | H03G 3/3068 714/752 |
| 2012/0004005 | A1 * | 1/2012 | Ahmed ............... | H04W 52/245 455/522 |
| 2017/0295342 | A1 * | 10/2017 | Jeng .................... | H03G 3/3005 |

* cited by examiner

*Primary Examiner* — Aristocratis Fotakis
(74) *Attorney, Agent, or Firm* — Haynes and Boone, LLP

(57) ABSTRACT

A circuit includes an AGC adaptation circuit configured to receive a first signal generated based on an AGC output signal from an AGC circuit. The AGC circuit applies an AGC gain to an AGC input signal to generate the AGC output signal. The AGC adaptation circuit determines an observed value of the first signal, and determines a AGC adaptation step size based on the observed value and a predetermined target value associated with the first signal. The AGC adaptation circuit provides a second signal to adjust the AGC gain of the AGC circuit using the AGC adaptation step size.

20 Claims, 6 Drawing Sheets

SYSTEM AND METHOD FOR AUTOMATIC GAIN CONTROL ADAPTATION

TECHNICAL FIELD

Examples of the present disclosure generally relate to integrated circuits ("ICs") and, in particular, to an embodiment related to automatic gain control adaptation.

BACKGROUND

As data rates increase to meet demand for higher data throughput, signals transmitted through a communication channel are increasing susceptible to corruption by frequency-dependent signal loss of the communication channel, such as inter-symbol interference (ISI), and other noise, such as crosstalk, echo, signal dispersion, and distortion. A receiver may use an automatic gain control (AGC) circuit to compensate for channel loss, and a decision feedback equalizer (DFE) to remove ISI and other noise by using a feedback loop based on previously decided symbols from the received signal. The receiver may automatically adapt its components, e.g., the AGC circuit and DFE circuit to the receiver signals to improve bit error rate (BER) performance. As the data rate increases, high speed communication protocols have higher timing requirements for the receiver adaptation time.

Accordingly, it would be desirable and useful to provide an improved way of implementing receiver adaptation including AGC adaptation and equalizer adaptation.

SUMMARY

In some embodiments in accordance with the present disclosure, a circuit includes an AGC adaptation circuit configured to: receive a first signal generated based on an AGC output signal from an AGC circuit, wherein the AGC circuit is configured to apply an AGC gain to an AGC input signal to generate the AGC output signal; determine an observed value of the first signal; determine a AGC adaptation step size based on the observed value and a predetermined target value associated with the first signal; and provide a second signal to adjust the AGC gain of the AGC circuit using the AGC adaptation step size.

In some embodiments, the AGC adaptation circuit is configured to: generate the AGC adaptation step size based on a difference between the observed value and the predetermined target value.

In some embodiments, the AGC adaptation circuit is configured to: generate the AGC adaptation step size based on performing a modulo operation where the difference between the observed value and the predetermined target value is a dividend.

In some embodiments, a divisor of the modulo operation is a positive integer N determined based on a predetermined maximum AGC adaptation step size.

In some embodiments, the AGC adaptation circuit is configured to: at a first time, determine a first AGC adaptation step size based on a first difference between the observed value and the predetermined target value; and at a second time, determine a second AGC adaptation step size based on a second difference between the observed value and the predetermined target value, the second difference being greater from the first difference, wherein the second AGC adaptation step size is greater than the first AGC adaptation step size.

In some embodiments, the AGC adaptation circuit is configured to: look up the AGC adaptation step size in a lookup table based on the difference between the observed value and the predetermined target value.

In some embodiments, the observed value of the first signal includes an average maximum eye height of the first signal.

In some embodiments, the circuit includes an equalizer adaptation circuit configured to: receive the first signal from an equalizer circuit, wherein the equalizer circuit is configured to generate the first signal from the AGC output signal; and provide a third signal to adjust parameters of the equalizer circuit using an equalizer adaptation step size.

In some embodiments, the equalizer adaptation step size is a fixed value.

In some embodiments, the equalizer adaptation circuit is configured to: determine the equalizer adaptation step size based on the AGC adaptation step size.

In some embodiments, a method includes receiving a first signal generated based on an AGC output signal from an AGC circuit, wherein the AGC circuit is configured to apply an AGC gain to an AGC input signal to generate the AGC output signal; determining an observed value of the first signal; determining a AGC adaptation step size based on the observed value and a predetermined target value associated with the first signal; and providing a second signal to adjust the AGC gain of the AGC circuit using the AGC adaptation step size.

In some embodiments, the method includes generating the AGC adaptation step size based on a difference between the observed value and the predetermined target value.

In some embodiments, the method includes generating the AGC adaptation step size based on performing a modulo operation, wherein the difference between the observed value and the predetermined target value is a dividend of the modulo operation.

In some embodiments, the method includes at a first time, determining a first AGC adaptation step size based on a first difference between the observed value and the predetermined target value; and at a second time, determining a second AGC adaptation step size based on a second difference between the observed value and the predetermined target value, the second difference being greater from the first difference, wherein the second AGC adaptation step size is greater than the first AGC adaptation size.

In some embodiments, the method includes looking up the AGC adaptation step size in a lookup table based on the difference between the observed value and the predetermined target value.

In some embodiments, the method includes providing a third signal based on the first signal to adjust parameters of the equalizer circuit using an equalizer adaptation step size.

DETAILED DESCRIPTION

Figure 1:
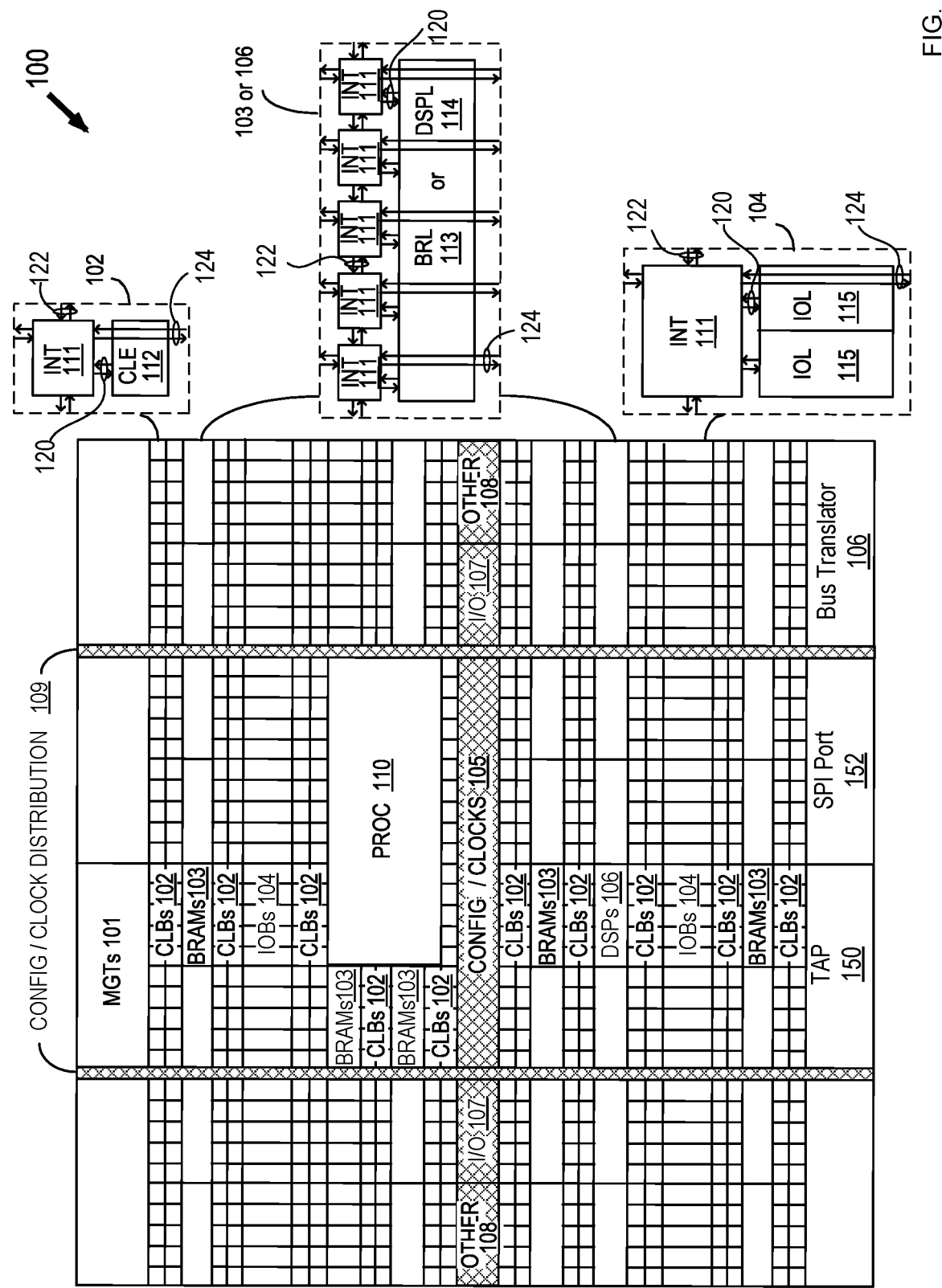
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, a receiver may automatically adapt its components, e.g., its AGC circuit and DFE circuit, to the receiver signals to improve bit error rate (BER) performance, and it would be desirable and useful to provide an improved way of implementing receiver adaptation including AGC adaptation and equalizer adaptation.

For integrated circuit (IC) solutions, it has been discovered that by configuration the adaptation step sizes for the adaptation loops of the receiver, including the AGC adaptation loop and equalizer adaptation loop, convergence time for receiver adaptation is improved while ensuring the stability.

Various advantages may be present in various applications of the present disclosure. No particular advantage is required for all embodiments, and different embodiments may offer different advantages. One of the advantages of some embodiments is that by dynamically adjusting the adaptation step size of the AGC loop to have a larger step size when the AGC loop is further away from convergence, convergence time for the AGC loop is improved, which in turn improves the convergence time of the receiver equalization. Yet another of the advantages of some embodiments is that by dynamically adjusting the adaptation step size of the AGC loop to have a smaller step size when the AGC loop is closer to convergence, the AGC loop stability is ensured. Yet another of the advantages of some embodiments is that by providing options of using either fixed or variable step size for each of the AGC loop and the equalizer loop, design flexibility is improved.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multigigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2:
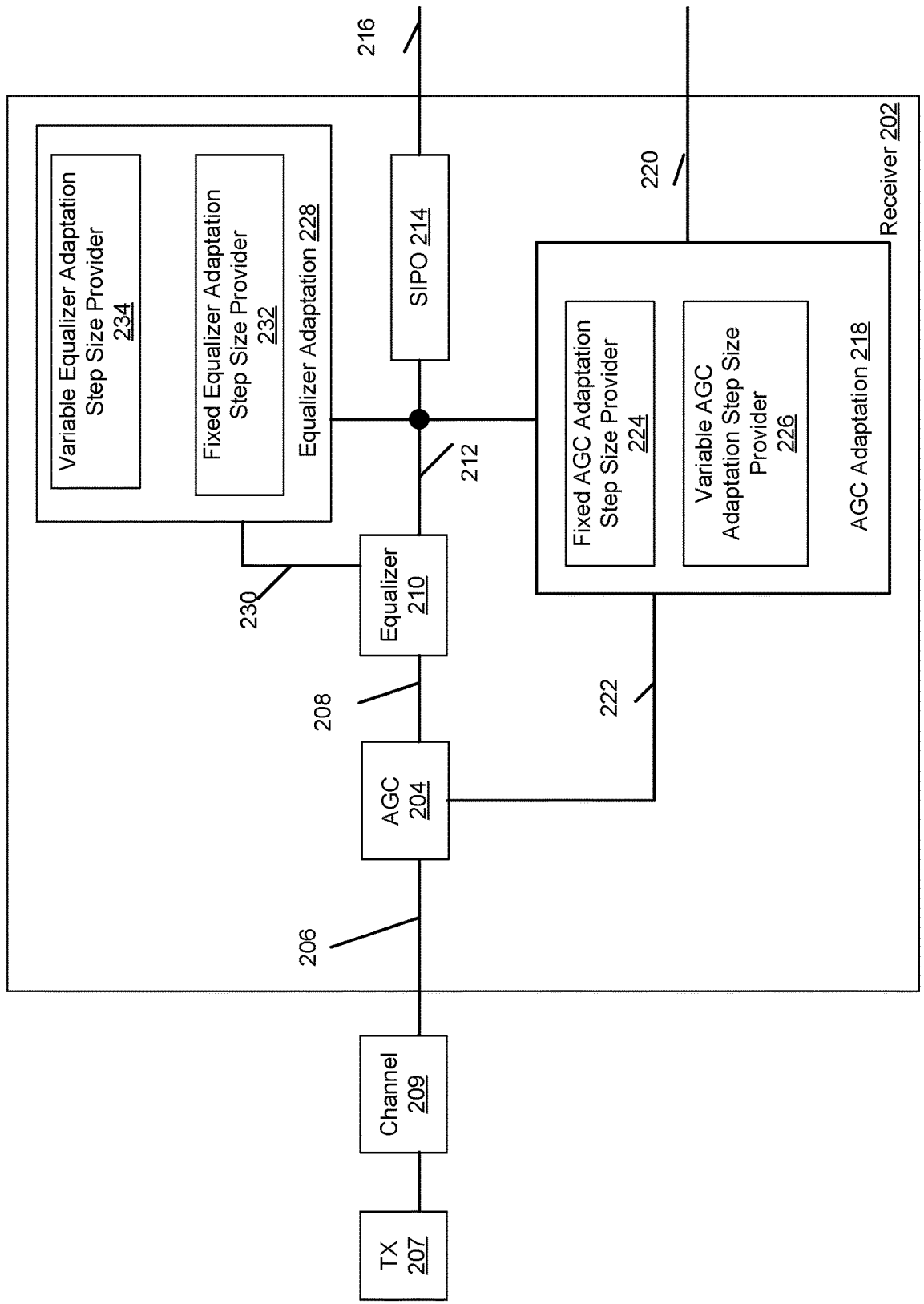
FIG. 2 is a block diagram illustrating an exemplary architecture for an IC configured for automatic gain control adaptation in a receiver according to some embodiments of the present disclosure.

Referring to the example of FIG. 2, illustrated is an IC configured for automatic adaptation in a receiver having an AGC circuit and an equalizer circuit. A receiver 202 includes an AGC circuit 204 coupled to receive an input signal 206. In an example, the input signal 206 is provided by a transmitter 207 through channel 209. In another example, the input signal 206 is provided by a linear equalizer generated from a received signal through channel 209. The AGC circuit 204 applies an AGC gain to the input signal 206 to generate an AGC output signal 208. The AGC output signal 208 is sent to an equalizer circuit 210 including e.g., a decision feedback equalization (DFE) circuit, a feedforward equalization (FFE) circuit, any suitable equalizer circuit, and/or a combination thereof. In an example, the equalizer circuit 210 includes a feedback (FIR) filter and a decision slicer, where the decision slicer makes a symbol decision and ISI is the subtracted from the input signal via the feedback FIR filter based on the symbol decision. The equalizer circuit 210 generates an equalized signal 212 by applying equalization to the AGC output signal 208 using various equalization techniques including e.g., decision feedback equalization, feedforward equalization, etc. In some embodiments, a serial in parallel out (SIPO) 214 may be used to convert the serial signal 212 to a parallel output signal 216.

As illustrated in the example of FIG. 2, the receiver 202 includes one or more adaptation feedback loops (also referred to as adaptation loop or loop) for equalization adaptation. The AGC adaptation circuit 218 is used to automatically adapt the AGC circuit 204 in the AGC adaptation loop (e.g., including AGC circuit 204, equalizer circuit 210, and AGC adaptation circuit 218). The AGC adaptation circuit 218 receives a target value signal 220 (e.g., from a configuration circuit, an operator, etc.), receives the equalized signal 212 from the equalizer circuit 210, and generates an AGC adaptation signal 222 based on the target value signal 220 and equalized signal 212 to adjust the AGC parameters (e.g., AGC gain) of the AGC circuit 204 automatically. In some examples, the AGC adaptation signal 222 is used to adjust (e.g., increase, decrease) the AGC parameters (e.g., AGC gain) in a fixed step size (e.g., from a fixed AGC adaptation step size provider 224 of the AGC adaptation circuit 218) in the multiple steps for AGC adaptation.

In some embodiments, the AGC adaptation signal 222 is used to adjust (e.g., increase, decrease) the AGC parameters (e.g., AGC gain) in a variable step size (e.g., from a variable AGC adaptation step size provider 226 of the AGC adaptation circuit 218) in the multiple steps for AGC adaptation. The variable step size may be determined based on a difference between an observed value of the equalized signal 212 and the target value 220 (e.g., by computing dynamically based on a formula, by looking up in a lookup table, etc.). By dynamically adjusting the adaptation step size of the AGC loop (e.g., having a larger step size when the AGC loop is further away from convergence and a smaller step size when the AGC loop is closer to convergence), convergence time for the AGC loop (and the receiver equalization) is improved, which in turn improves the convergence time of the receiver equalization while ensuring the loop stability. The closeness to convergence may be determined based on a difference between the observed value of the equalized signal 212 and the target value signal 220.

In the example of FIG. 2, an equalizer adaptation circuit 228 is used to automatically adapt the equalizer circuit 210 (e.g., adapting filter tap coefficients (weights) of a DFE) in the equalizer adaptation loop (e.g., including equalizer circuit 210 and equalizer adaptation circuit 228). The equalizer adaptation circuit 228 receives the equalized signal 212 from the equalizer circuit 210, and generates an equalizer adaptation signal 230 based on the equalized signal 212. Various equalizer adaptation techniques may be used, including e.g., adaptation techniques based on zero-forcing (ZF), minimum mean square error (MMSE), maximum eye-opening, least mean square (LSM), etc. In some examples, the equalizer adaptation signal 230 is used to adjust parameters of the equalizer circuit 210 in a fixed step size (e.g., from a fixed equalizer adaptation step size provider 232 of the equalizer adaptation circuit 228) in the multiple steps for equalizer adaptation.

In some embodiments, the equalizer adaptation signal 230 is used to adjust equalizer parameters in a variable step size (e.g., from a variable equalizer adaptation step size provider 234 of the equalizer adaptation circuit 228) in the multiple steps for equalizer adaptation. By dynamically adjusting the adaptation step size of the equalizer loop (e.g., having a larger step size when the equalizer loop is further away from convergence and a smaller step size when the equalizer loop is closer to convergence), convergence time for the equalizer loop (and the receiver equalization) is improved, which in turn improves the convergence time of the receiver equalization while ensuring the loop stability.

In some embodiments, the variable step size for equalizer adaptation may be determined based on the AGC adaptation loop. As shown in FIG. 2, the AGC adaptation loop is an outer loop of the equalizer adaptation loop. Each AGC adaptation step includes a plurality of equalizer adaptation steps. The equalizer adaptation step size of those plurality of equalizer adaptation steps may be determined based on the corresponding AGC adaptation step size of that particular AGC adaptation step. In a particular example, a first AGC adaptation step has a first AGC adaptation step size of 0.8, and the step size of the plurality of equalizer adaptation steps in that first AGC adaptation step may be a fixed step size (e.g., 0.09) determined based on the AGC adaptation step size. The second AGC adaptation step following the first AGC adaptation step has a second AGC adaptation size of 0.6. The step size of the plurality of equalizer adaptation steps in that second AGC adaptation step may be adjusted to an updated value (e.g., 0.05) based on the second AGC adaptation size of 0.6.

In various embodiments, different adaptation techniques (e.g., zero-forcing (ZF), minimum mean square error (MMSE), maximum eye-opening, etc.) may be used. While maximum eye-opening adaptation and NRZ and PAM4 signals are used as examples in the description below, it is exemplary only and not intended to be limiting beyond what is specifically recited in the claims that follow. A POSITA would have understood that the variable step size adjustment techniques described below may be used in any suitable adaptation methods with any types of input signals.

Figure 3:
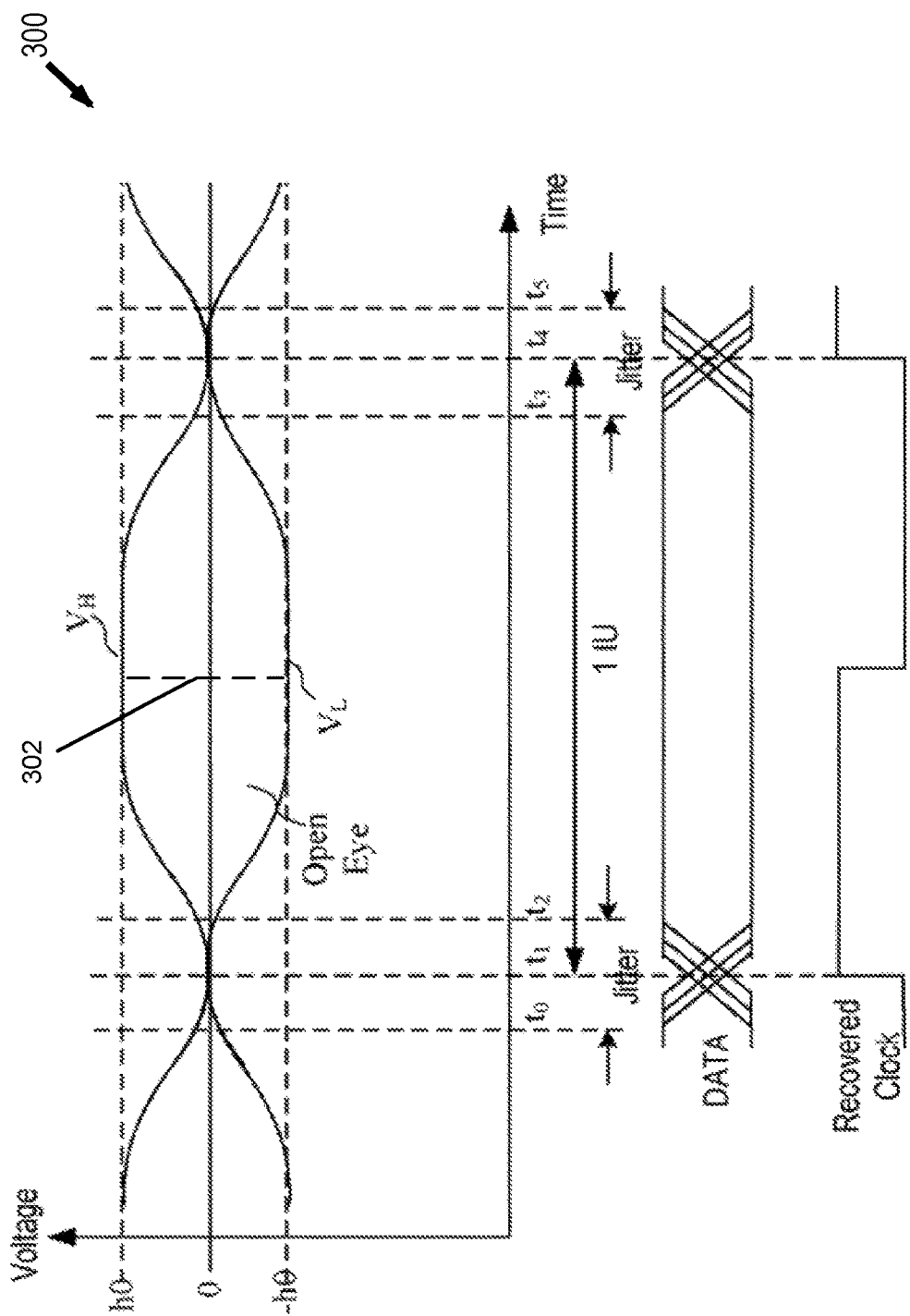
FIG. 3 is an eye diagram for non-return-to-zero (NRZ) data signal received by a receiver according to some embodiments of the present disclosure.
Figure 4:
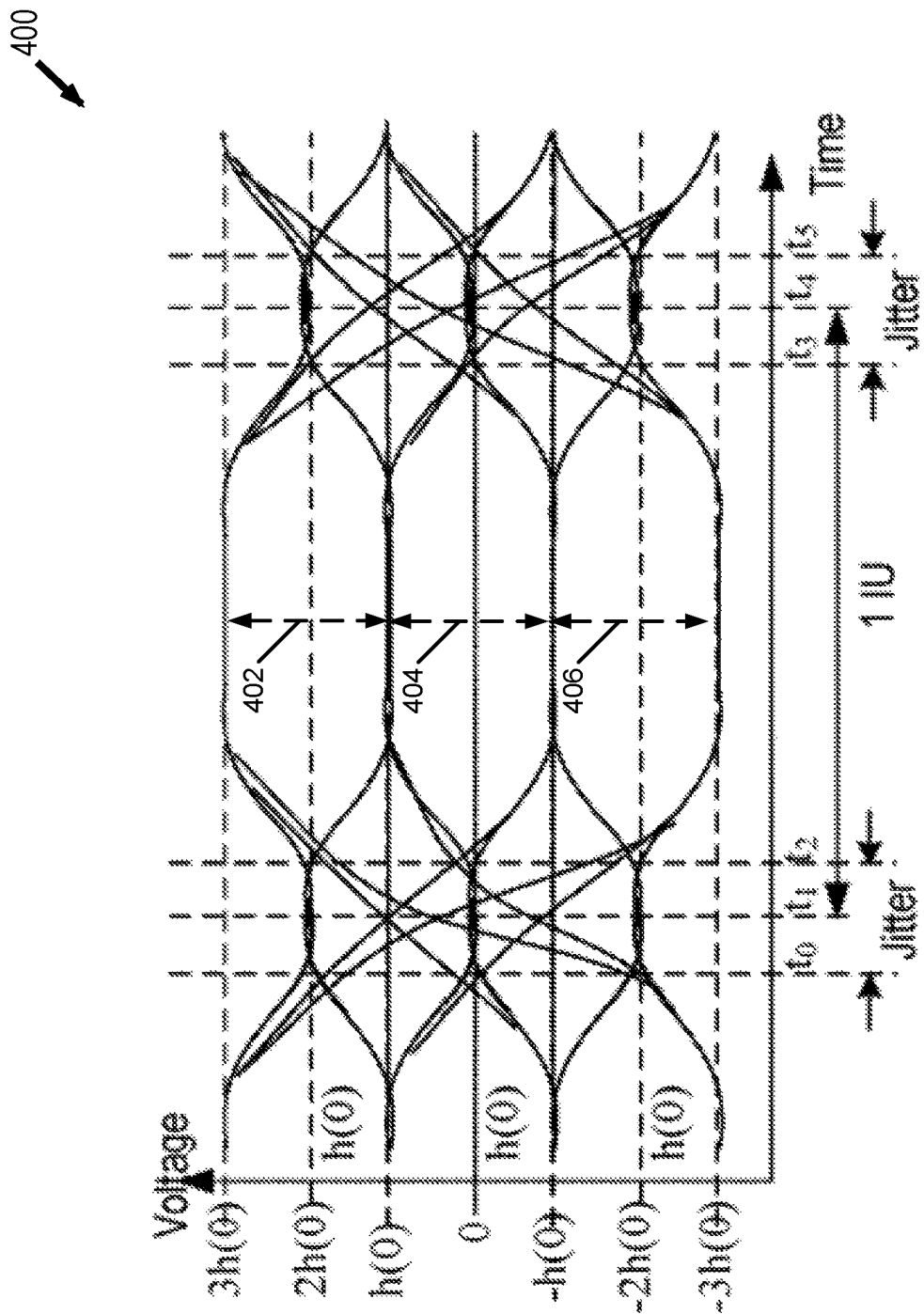
FIG. 4 is an eye diagram for pulse-amplitude modulation 4 (PAM4) data signal received by a receiver according to some embodiments of the present disclosure.

Referring to FIGS. 3 and 4, eye diagrams showing characteristics of an NRZ data signal and a PAM4 data signal respectively are illustrated. A received AC signal is typically defined using an "eye pattern," and it is desirable to have a large "open eye" so that a detected value at a given time in the middle of the eye pattern (between the jitters on the ends of the eye pattern) can easily be detected as being associated with an expected voltage at the top or bottom of the eye pattern. In the eye diagram 300 of FIG. 3 representing an NRZ signal that is symmetrically about 0 volt, the expected value at the top of the eye pattern (e.g., corresponding to logical "1") is represented by h(0), and the expected value at the bottom of the eye pattern (e.g., corresponding to logical "0") is represented by −h(0). An eye height 302 is height between the top and bottom of the eye pattern. Jitter may generally be detected between times t0 to t2 and times t3 to t5. The data is preferably detected at the center of the eye pattern (e.g., at the falling edge of the recovered clock signal about half way between t2 and t3). As shown in the eye diagram 400 of FIG. 4, a received PAM4 signal may have voltages with values of −3h(0), −h(0), h(0), and 3h(0), corresponding to logic values 00, 01, 10, and 11 respectively. Eye heights 402, 404, and 406 are eye heights for the upper, middle, and lower eyes respectively.

Figure 5:
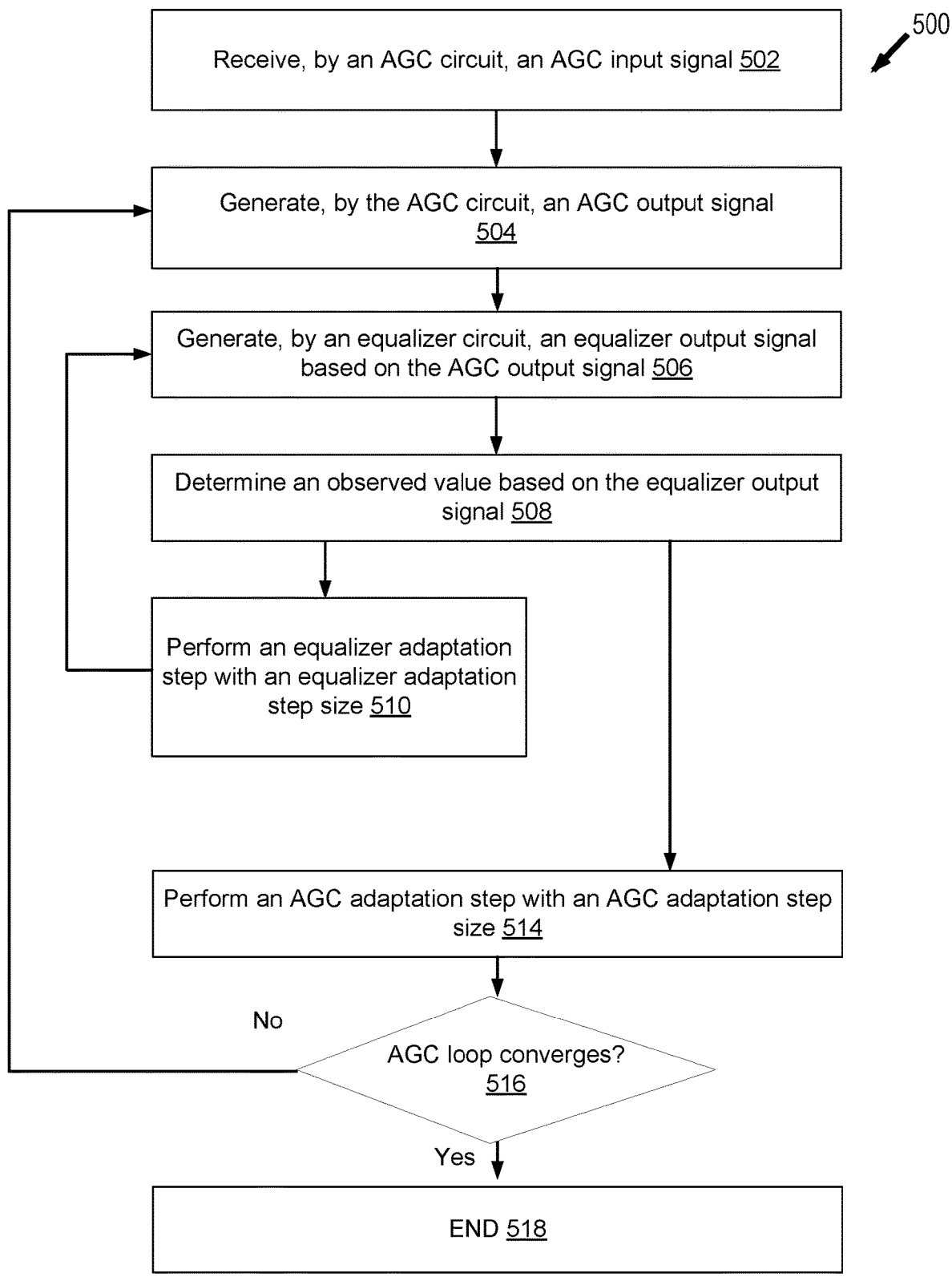
FIG. 5 is a flowchart illustrating a method for AGC adaptation according to some embodiments of the present disclosure.

Referring to FIG. 5, an example method 500 for receiver equalization adaptation is illustrated. The method 500 begins at block 502, where an AGC circuit receives an AGC input signal. In the example of FIG. 2, the AGC circuit 204 of the receiver 202 receives an AGC input signal 206.

The method 500 may proceed to block 504, where the AGC circuit generates an AGC output signal. In the example of FIG. 2, the AGC circuit 204 generates an AGC output signal 21 by applying an AGC gain to the AGC input signal 206.

The method 500 may proceed to block 506, where an equalizer circuit generates an equalizer output signal based on the AGC output signal. In the example of FIG. 2, the equalizer circuit 210 receives the signal 208 from the AGC circuit 204, and generates an equalizer output signal 212 (e.g., using DFE, FFE, any suitable equalization techniques, and/or a combination thereof).

The method 500 may proceed to block 508, where an observed value is determined based on the equalizer output signal. In the example of FIG. 2, an observed value (e.g., an average maximum eye height) of the equalizer output signal 212 may be computed (e.g., by AGC adaptation circuit 218, equalizer adaptation circuit 228, or any other adaptation circuit). It is noted that while an average maximum eye height is computed as the observed value for a maximum eye-opening adaptation method, different types of observed values (e.g., MMSE value, LSM value, etc.) may be computed and used for other equalization adaptation methods (e.g., minimum mean square error (MMSE), least mean square (LSM), etc.). In other words, the type of observed value of the equalizer output signal is determined based on the equalization adaptation method. It is noted that different adaptation loops (e.g., equalizer adaptation loop, AGC adaptation loop, other suitable adaptation loop in the receiver) may use the same or different equalization adaptation methods, and therefore, may use the same or different types of observed values. In one example, the equalizer adaptation loop may use a MMSE adaptation method, and the AGC adaptation loop may use a maximum eye-opening method.

The method 500 may proceed to block 510, where an equalizer adaptation step for the equalizer loop is performed to adjust (e.g., increase or decrease) the parameters of the equalizer circuit by a fixed or variable equalizer adaptation step size (e.g., provided by either fixed equalizer adaptation step size provider 232 or variable equalizer adaptation step size provider 234). In some embodiments, the variable equalizer adaptation step size may be determined based on the AGC adaptation step size of the corresponding AGC adaptation step. For example, one or more equalizer adaptation steps may be performed in a single AGC adaptation step. In one example, those one or more equalizer adaptation steps may have the same equalizer adaptation step size that is determined based on the step size of the single AGC adaptation step. In another example, those one or more equalizer adaptation steps may have different equalizer adaptation step sizes that are determined based on the step size of the single AGC adaptation step, the difference between the observed value and a target value, any other suitable equalizer conditions, and/or a combination thereof. In alternative embodiments, the equalizer adaptation step size may be a fixed step size that is not dependent on the AGC adaptation step size of the corresponding AGC adaptation step.

The method 500 may proceed to block 506 to perform the next equalizer adaptation step following block 510. In some embodiments, if at block 510 it is determined that the equalizer loop converges.

The method 500 may proceed to block 514 to perform an AGC adaptation step to adjust (e.g., increase or decrease) parameters (e.g., AGC gain) of the AGC circuit with a fixed AGC adaptation step size or a variable AGC adaptation step size. As described in detail with reference to FIG. 6 below, in an example, the variable AGC adaptation step size is dynamically determined based on the observed value of the equalizer output signal and a target value.

The method 500 may proceed to block 516 to determine whether the AGC loop converges. If at block 516 it is determined that the AGC loop does not converge, then the method 500 goes to block 504 to perform another AGC adaptation step. If at block 516 it is determined that the AGC loop converges, the method 500 goes to block 518, and the receiver equalization adaptation is completed. It is noted that in some embodiments, block 514 may determine whether the AGC loop converges before adjusting parameters of the AGC circuit, and the method 500 may go to block 504 or block 518 based on the AGC loop convergence determination from block 514.

Figure 6:
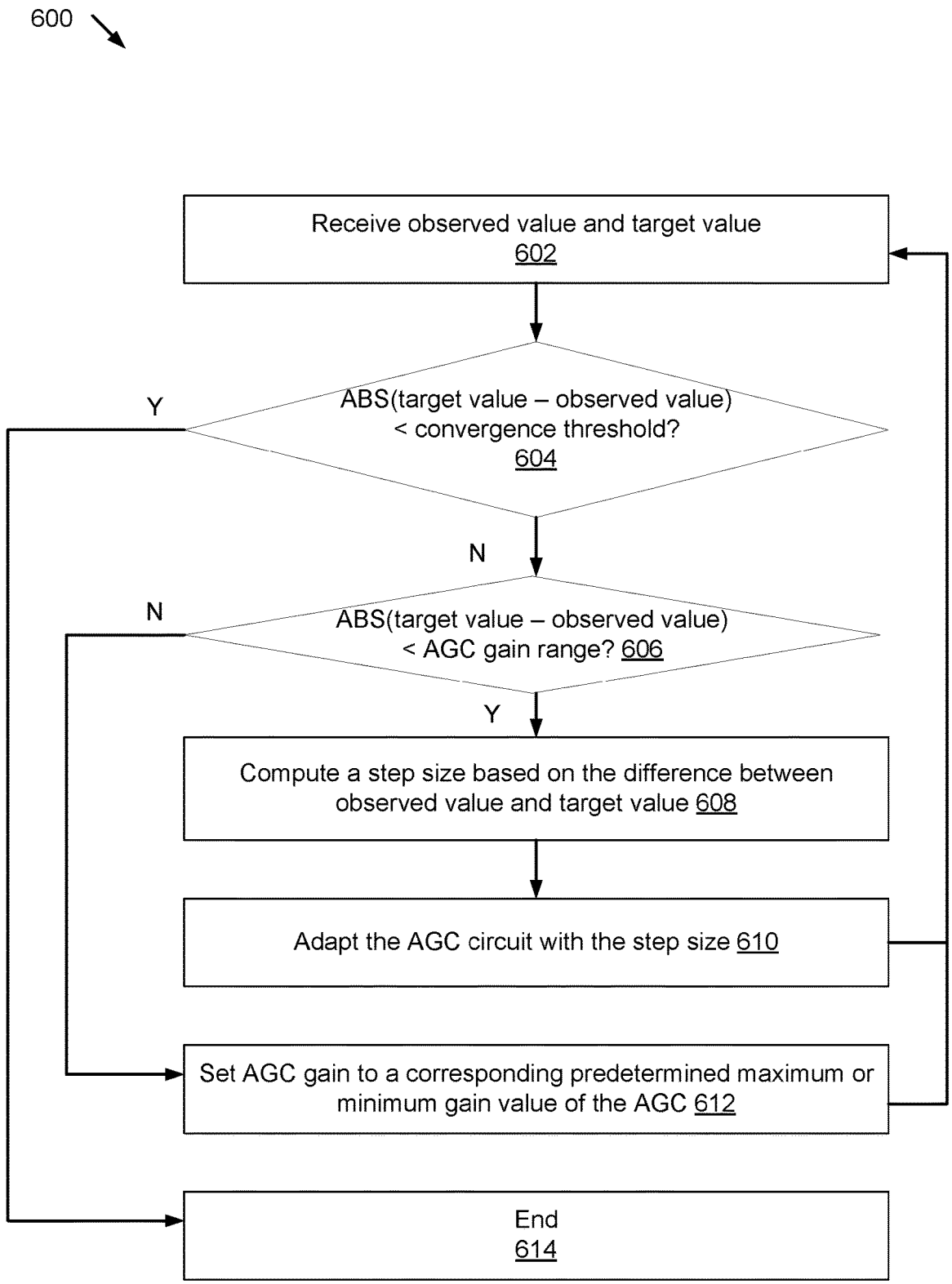
FIG. 6 is a flowchart illustrating a method for dynamically determining an AGC adaptation step size for the method of FIG. 5 according to some embodiments of the present disclosure.

Referring to the example of FIG. 6, a method 600 for performing an AGC adaptation step (e.g., block 514 of method 500 of FIG. 5) is illustrated. The method 600 starts at block 602, where an observed value and a target value are received. In various embodiments, the target value may be determined based on various applications of the receiver, and may be configured by a user. In an example, in an example, an optimal target value (e.g., a target voltage range) is computed based on information of the channel (e.g., channel loss information including insertion loss from a user).

The method 600 proceeds to block 604, where it is determined whether the difference between the observed value and the target value is less than a convergence threshold. If at block 604 it is determined that the difference D between the observed value and the target value is less than a convergence threshold, then the method 600 proceeds to block 614 to complete the AGC adaptation step because the AGC loop converges.

If at block 604 it is determined that the difference D between the observed value and the target value is greater than a convergence threshold, the method 600 proceeds to block 606, where it is determined whether the difference between the observed value and the target value is less than the AGC gain range. If at block 606 it is determined that the difference is greater than the AGC gain range, then the method 600 proceeds to block 612 to adjust the AGC gain of the AGC circuit to a corresponding maximum or minimum gain value of the AGC. In some embodiments, the method 600 proceeds to block 602 waiting to receive the next observed value.

If at block 606 it is determined that the difference D is less than the AGC gain range, the method 600 proceeds to block 608 to compute the AGC adaptation step size based on that difference D (e.g., by variable AGC adaptation step size provider 226). By dynamically adjusting the adaptation step size of the AGC loop to have a larger step size for a larger difference D (e.g., when the AGC loop is further away from convergence), convergence time for the AGC loop is improved, which in turn improves the convergence time of the receiver equalization. Furthermore, by dynamically adjusting the adaptation step size of the AGC loop to have a smaller step size for a smaller difference D (e.g., when the AGC loop is closer to convergence), the AGC loop stability is ensured.

In some embodiments, a lookup table is used to lookup the corresponding AGC adaptation step size for the difference D. In some alternative embodiments, a modulo operation is performed to compute the AGC adaptation step size as D modulo N, where N is a positive integer that is greater than 1. For a particular N, the AGC adaptation step size may be between 0 to N−1. In other words, the AGC adaptation step size may be dynamically changed between 0 and N−1, and a higher N corresponds to a higher maximum AGC adaptation step size. N may be a value less than or equal to D. In some examples, N may be determined based on a maximum step size of the AGC circuit. Alternatively, in some examples, N may be configured by a user. In an example where N is 2, the AGC adaptation step size may be dynamically changed between 0 and 1. In another example where N is 3, the AGC adaptation step size may be dynamically changed among 0, 1, and 2. In yet another example where N is 4, the AGC adaptation step size may be dynamically changed among 0, 1, 2, and 3.

The method 600 may then proceed to block 610, where the AGC circuit 204 is adapted by adjusting its gain with the AGC adaptation step size. In some embodiments, the method 600 proceeds to block 602 waiting to receive the next observed value.

It is noted that various configurations illustrated in FIGS. 1-6 are exemplary only and not intended to be limiting beyond what is specifically recited in the claims that follow. It will be understood by those skilled in that art that other configurations may be used.

One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or another storage device. The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A circuit, comprising:
    an AGC adaptation circuit configured to:
        receive a first signal generated based on an AGC output signal from an AGC circuit,
            wherein the AGC circuit is configured to apply an AGC gain to an AGC input signal to generate the AGC output signal;
        determine an observed value of the first signal;
        determine a AGC adaptation step size based on performing a modulo operation using the observed value, a predetermined target value associated with the first signal, and a predetermined maximum AGC adaptation step size; and
        provide a second signal to adjust the AGC gain of the AGC circuit using the AGC adaptation step size.

2. The circuit of claim 1, wherein the AGC adaptation circuit is configured to:
    generate the AGC adaptation step size based on a difference between the observed value and the predetermined target value.

3. The circuit of claim 2, wherein the AGC adaptation circuit is configured to:
    generate the AGC adaptation step size based on performing the modulo operation where the difference between the observed value and the predetermined target value is a dividend.

4. The circuit of claim 3, wherein a divisor of the modulo operation is a positive integer N determined based on the predetermined maximum AGC adaptation step size.

5. The circuit of claim 2, wherein the AGC adaptation circuit is configured to:
    at a first time, determine a first AGC adaptation step size based on a first difference between the observed value and the predetermined target value; and
    at a second time, determine a second AGC adaptation step size based on a second difference between the observed value and the predetermined target value, the second difference being greater from the first difference,
    wherein the second AGC adaptation step size is greater than the first AGC adaptation step size.

6. The circuit of claim 2, wherein the AGC adaptation circuit is configured to:
    look up a second AGC adaptation step size in a lookup table based on the difference between the observed value and the predetermined target value.

7. The circuit of claim 1, wherein the observed value of the first signal includes an average maximum eye height of the first signal.

8. The circuit of claim 1, further comprising:
an equalizer adaptation circuit configured to:
receive the first signal from an equalizer circuit, wherein the equalizer circuit is configured to generate the first signal from the AGC output signal; and
provide a third signal to adjust parameters of the equalizer circuit using an equalizer adaptation step size.

9. The circuit of claim 8, wherein the equalizer adaptation step size is a fixed value.

10. The circuit of claim 8, wherein the equalizer adaptation circuit is configured to:
determine the equalizer adaptation step size based on the AGC adaptation step size.

11. A method, comprising:
receiving a first signal generated based on an AGC output signal from an AGC circuit,
wherein the AGC circuit is configured to apply an AGC gain to an AGC input signal to generate the AGC output signal;
determining an observed value of the first signal;
determining a AGC adaptation step size based on performing a modulo operation using the observed value, a predetermined target value associated with the first signal, and a predetermined maximum AGC adaptation step size; and
providing a second signal to adjust the AGC gain of the AGC circuit using the AGC adaptation step size.

12. The method of claim 11, further comprising:
generating the AGC adaptation step size based on a difference between the observed value and the predetermined target value.

13. The method of claim 12, further comprising:
generating the AGC adaptation step size based on performing the modulo operation, wherein the difference between the observed value and the predetermined target value is a dividend of the modulo operation.

14. The method of claim 13, wherein a divisor of the modulo operation is a positive integer N determined based on the predetermined maximum AGC adaptation step size.

15. The method of claim 14, further comprising:
at a first time, determining a first AGC adaptation step size based on a first difference between the observed value and the predetermined target value; and
at a second time, determining a second AGC adaptation step size based on a second difference between the observed value and the predetermined target value, the second difference being greater from the first difference,
wherein the second AGC adaptation step size is greater than the first AGC adaptation size.

16. The method of claim 12, further comprising:
looking up a second AGC adaptation step size in a lookup table based on the difference between the observed value and the predetermined target value.

17. The method of claim 12, further comprising:
wherein the observed value of the first signal includes an average maximum eye height of the first signal.

18. The method of claim 17, further comprising:
providing a third signal based on the first signal to adjust parameters of the equalizer circuit using an equalizer adaptation step size.

19. The method of claim 18, wherein the equalizer adaptation step size is a fixed value.

20. The method of claim 18, determining the equalizer adaptation step size based on the AGC adaptation step size.

* * * * *